(12) United States Patent
Ng et al.

(10) Patent No.: US 11,245,413 B2
(45) Date of Patent: Feb. 8, 2022

(54) DATA CONVERTER AND RELATED ANALOG-TO-DIGITAL CONVERTER, DIGITAL-TO-ANALOG CONVERTER AND CHIP

(71) Applicant: SHENZHEN GOODIX TECHNOLOGY CO., LTD., Guangdong (CN)

(72) Inventors: Si Herng Ng, Guangdong (CN); Wen-Chi Wang, Guangdong (CN)

(73) Assignee: SHENZHEN GOODIX TECHNOLOGY CO., LTD., Guangdong (CN)

( * ) Notice: Subject to any disclaimer, the term of this patent is extended or adjusted under 35 U.S.C. 154(b) by 0 days.

(21) Appl. No.: 16/889,316

(22) Filed: Jun. 1, 2020

(65) Prior Publication Data

US 2021/0203350 A1    Jul. 1, 2021

Related U.S. Application Data

(63) Continuation of application No. PCT/CN2019/076055, filed on Dec. 25, 2019.

(51) Int. Cl.
*H03M 3/00* (2006.01)
*H03M 1/12* (2006.01)

(52) U.S. Cl.
CPC ............ *H03M 3/464* (2013.01); *H03M 3/422* (2013.01); *H03M 3/462* (2013.01); *H03M 1/12* (2013.01)

(58) Field of Classification Search
CPC ............. H03M 1/66; H03M 3/00; H03M 1/12
See application file for complete search history.

(56) References Cited

U.S. PATENT DOCUMENTS 6,118,398 A    9/2000 Fisher et al.
8,022,850 B2 *  9/2011 Newman ............ H03M 1/0665
                                           341/144

(Continued)

FOREIGN PATENT DOCUMENTS

CN    101562454         10/2009
CN    106899304 A        6/2017

(Continued)

OTHER PUBLICATIONS

English Abstract Translation of Foreign Reference CN101562454.

(Continued)

*Primary Examiner* — Joseph J Lauture
(74) *Attorney, Agent, or Firm* — WPAT, P.C., Intellectual Property Attorneys; Anthony King

(57) ABSTRACT

The present application discloses a data converter (112). The data converter includes an input terminus (98), a digital-to-analog (D/A) converter (116) and a mapping unit (114). The input terminus is configured to receive an input signal. The D/A converter includes a plurality of D/A converter units configured to generate an output signal. The mapping unit is coupled between the input terminus and the D/A converter and is configured to cause the plurality of D/A conversion units to be equivalently arranged in a relative order in which the plurality of D/A conversion units are gated according to specific electrical characteristics of the plurality of D/A conversion units for digital-to-analog conversion. The present application further provides an A/D converter, a D/A converter and a related chip.

15 Claims, 14 Drawing Sheets

10

(56) References Cited

U.S. PATENT DOCUMENTS

| | | | |
|---|---|---|---|
| 9,214,953 | B1 | 12/2015 | Mengad |
| 10,020,817 | B1 | 7/2018 | Zhang |
| 2011/0006937 | A1* | 1/2011 | Zoso .................... H03M 3/422 |
| | | | 341/143 |
| 2013/0268572 | A1 | 10/2013 | Han et al. |
| 2019/0334545 | A1* | 10/2019 | Quiquempoix ....... H03M 3/464 |

FOREIGN PATENT DOCUMENTS

| | | |
|---|---|---|
| JP | 11031969 A | 2/1999 |
| JP | 2007534255 A | 11/2007 |
| TW | 479416 B | 3/2002 |

OTHER PUBLICATIONS

English Abstract Translation of Foreign Reference CN106899304A.
English Abstract Translation of Foreign Reference TW479416B.
International Searching Authority (ISA) Form 210—International Search Report of PCT/CN2019/076055.
International Searching Authority (ISA) Form 220—Notification of Transmittal of the International Search Report of PCT/CN2019/076055.
International Searching Authority (ISA) Form 237—Written Opinion of PCT/CN2019/076055.
As-filed PCT Request of PCT/CN2019/076055.
As-filed PCT Application of PCT/CN2019/076055.
Notification of Receipt of Search Copy in Chinese (Form PCT/ISA/202) of PCT/CN2019/076055.
English Abstract of JP11031969A.
English Abstract of JP2007534255A.
Tao Zeng et al.: "New calibration technique for current-steering DACs", «Circuits and Systems (ISCAS), Proceedings of 2010 IEEE International Symposium On», Jun. 2, 2010 (Jun. 2, 2010), pp. 573-576, XP032368325, DOI: doi:10.1109/ISCAS.2010.5537534.
You Li et al.: "Low-cost, high-precision DAC design based on ordered element matching", IEEE Transactions on Circuits and Systems-I: Regular Papers, vol. 66, No. 2: 502-512 (Feb. 2019).
Tao Zeng et al.: "An order-statistics based matching strategy for circuit components in data converters", IEEE Transactions on Circuits and Systems-I: Regular Papers, vol. 60, No. 1: 11-24 (Jan. 2013).

* cited by examiner

FIG. 4

DATA CONVERTER AND RELATED ANALOG-TO-DIGITAL CONVERTER, DIGITAL-TO-ANALOG CONVERTER AND CHIP

CROSS-REFERENCE TO RELATED APPLICATIONS

This application is a continuation of International Application No. PCT/CN2019/076055, filed on Feb. 25, 2019, the disclosure of which is hereby incorporated by reference in its entirety.

TECHNICAL FIELD

The present application relates to a converter; particularly to a data converter and a related analog-to-digital (A/D) converter, a digital-to-analog (D/A) converter and a chip.

BACKGROUND

In multi-bit delta-sigma (Δ-Σ) analog-to-digital (A/D) converters and digital-to-analog (D/A) converters, in order to solve the problem of device mismatch errors, a data weighted averaging technique is proposed, so as to carry out 1st-order noise shaping on the device mismatch errors; thereby greatly improving the signal-to-noise (S/N) ratio. However, when the amplitude of the input signal is relatively small (for example, the amplitude is about −50 dBFS), the data weighted averaging technique will cause repetition in the selection pattern of the digital-to-analog converter unit, and the repetition will be folded back into the frequency band to generate a spurious tone, which will still worsen the S/N ratio.

At present, one commonly used solution is to add an additional digital-to-analog converter unit to the digital-to-analog converter; this technology is called an incremental data weighted average technology. When the amplitude of the input signal is relatively small, using the incremental data weighted average technology can make the selection pattern of the digital-to-analog converter unit less prone to repeatability, thereby eliminating the spurious tone. However, when the amplitude of the input signal is around 1 LSB, the selection pattern of the digital-to-analog converter unit still shows repetition, which in turn produces the spurious tone.

In view of the foregoing, there is a need for further improvements and innovations to address the above-mentioned issues.

BRIEF SUMMARY OF THE INVENTION

One purpose of the present application is directed to a data converter; in particular, to a data converter, A/D converter, D/A converter and a related chip, so as to address the above-mentioned issues.

One embodiment of the present application discloses a data converter. The data converter includes an input terminus, a digital-to-analog (D/A) converter and a mapping unit. The input terminus is configured to receive an input signal. The D/A converter includes a plurality of D/A conversion units configured to generate an output signal. The mapping unit is coupled between the input terminus and the D/A converter and is configured to cause the plurality of D/A conversion units, according to a specific electrical characteristic of the plurality of D/A conversion units, to be equivalently arranged in a relative order in which the plurality of D/A conversion units are selected for digital-to-analog conversion.

One embodiment of the present application discloses an analog-to-digital (A/D) converter, which configured to convert an analog signal into a digital signal. The A/D converter includes an input terminus, a low-pass filter, a quantizer and a feedback loop. The input terminus is configured to receive the analog signal. The low-pass filter is coupled to the input terminus and generates a low-pass signal according to the analog signal. The quantizer is configured to generate a quantized signal according to the low-pass signal. The feedback loop is configured to feed the quantized signal back to an output terminus of the low-pass filter. The feedback loop includes the data converter.

One embodiment of the present application discloses a D/A converter, configured to convert a digital signal into an analog signal. The D/A converter includes an input terminus, an upsampling filter, a quantizer and the data converter. The input terminus is configured to receive the digital signal. The upsampling filter is coupled to the input terminus and generates an upsampled signal according to the digital signal. The quantizer is configured to generate a quantized signal according to the upsampled signal. The data converter is configured to generate the analog signal according to the quantized signal.

One embodiment of the present application discloses a chip. The chip includes the above data converter.

One embodiment of the present application discloses a chip. The chip includes the above A/D converter.

One embodiment of the present application discloses a chip. The chip includes the above D/A converter.

The data converter, A/D converter, D/A converter and related chip disclosed in the present application can effectively inhibit the spurious tone when the selection pattern of D/A conversion units shows repetition, so as to improve the S/N ratio.

BRIEF DESCRIPTION OF TI-FE DRAWINGS

FIG. 4 is a schematic diagram illustrating the gating status of each D/A conversion unit according to embodiments of the present application.

DETAILED DESCRIPTION

Figure 1:
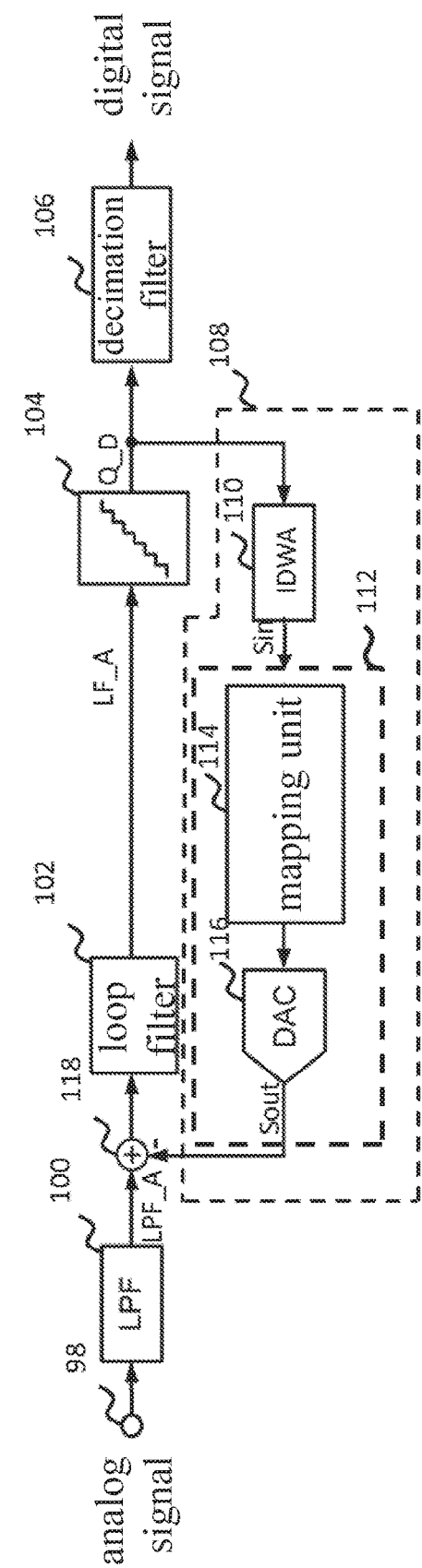
FIG. 1 is a schematic block diagram of multi-bit Δ-ΣA/D converter according to one embodiment of the present application.

The following disclosure provides many different embodiments, or examples, for implementing different features of the application. Specific examples of components and arrangements are described below to simplify the present disclosure. These are, of course, merely examples and are not intended to be limiting. For example, the formation of a first feature over or on a second feature in the description that follows may include embodiments in which the first and the second features are formed in direct contact, and may also include embodiments in which additional features may be formed between the first and the second features, such that the first and the second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for the ease of the description to describe one element or feature's relationship with respect to another element(s) or feature(s) as illustrated in the drawings. The spatially relative terms are intended to encompass different orientations of the device in use or operation in addition to the orientation depicted in the figures. The apparatus may be otherwise oriented (e.g., rotated by 90 degrees or at other orientations) and the spatially relative descriptors used herein may likewise be interpreted accordingly.

Notwithstanding that the numerical ranges and parameters setting forth the broad scope of the application are approximations, the numerical values set forth in the specific examples are reported as precisely as possible. Any numerical value, however, inherently contains certain errors necessarily resulting from the standard deviation found in the respective testing measurements. Also, as used herein, the term "about" generally means within 10%, 5%, 1%, or 0.5% of a given value or range. Alternatively, the term "about" means within an acceptable standard error of the mean when considered by one of ordinary skill in the art. As could be appreciated, other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the term "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

FIG. 1 is a schematic block diagram illustrating a multi-bit Δ-Σ (sigma-delta) A/D converter 10 according to embodiments of the present application. Referring to FIG. 1, the multi-bit Δ-ΣA/D converter 10 is configured to convert an analog signal into a digital signal. The multi-bit Δ-ΣA/D converter 10 includes an input terminus 98, a low-pass filter (LPT) 100, a loop filter 102, a quantizer 104, a decimation filter 106, an incremental data weighted averaging (IDWA) circuit 110, a data converter 112 and a logic unit 118, wherein the incremental data weighted averaging circuit 110 and the data converter 112 are disposed on the feedback loop 108. The incremental data weighted averaging circuit 110 us coupled between the quantizer 104 and the data converter 112.

The input terminus 98 is configured to receive the analog signal, the low-pass filter 100 is coupled to the input terminus 98 and generates a low-pass signal LPF_A according to the analog signal. The loop filter 102 is configured to generate a loop filter signal LF_A according to the low-pass signal LPF_A and the output Sout of the feedback loop 108, the quantizer 104 is coupled to the loop filter 102 and is configured to generate a quantized signal Q_D according to the loop filter signal LF_A. The decimation filter 106 is configured to provide a multi-bit digital signal based on the quantized signal Q_D. The feedback loop 108 is configured to feed the quantized signal Q_D back to an output terminus of the low-pass filter 100. Specifically, the incremental data weighted averaging circuit 110 is configured to provide the input signal Sin required by the data converter 112 based on the quantized signal Q_D. The data converter 112 is configured to generate an output signal Sout to the logic unit 118 based on the input signal Sin. The logic unit 118 is configured to subtract the output signal Sout from the low-pass signal LPF_A and then provide the subtraction result to the loop filter 102. It should be noted that the present application is not limited to the incremental data weighted averaging circuit 110; in some embodiments, the incremental data weighted averaging circuit 110 may be implemented using other circuits with similar functions; for example, it is feasible to use the data weighted averaging circuit to replace the incremental data weighted averaging circuit 110.

Figure 2:
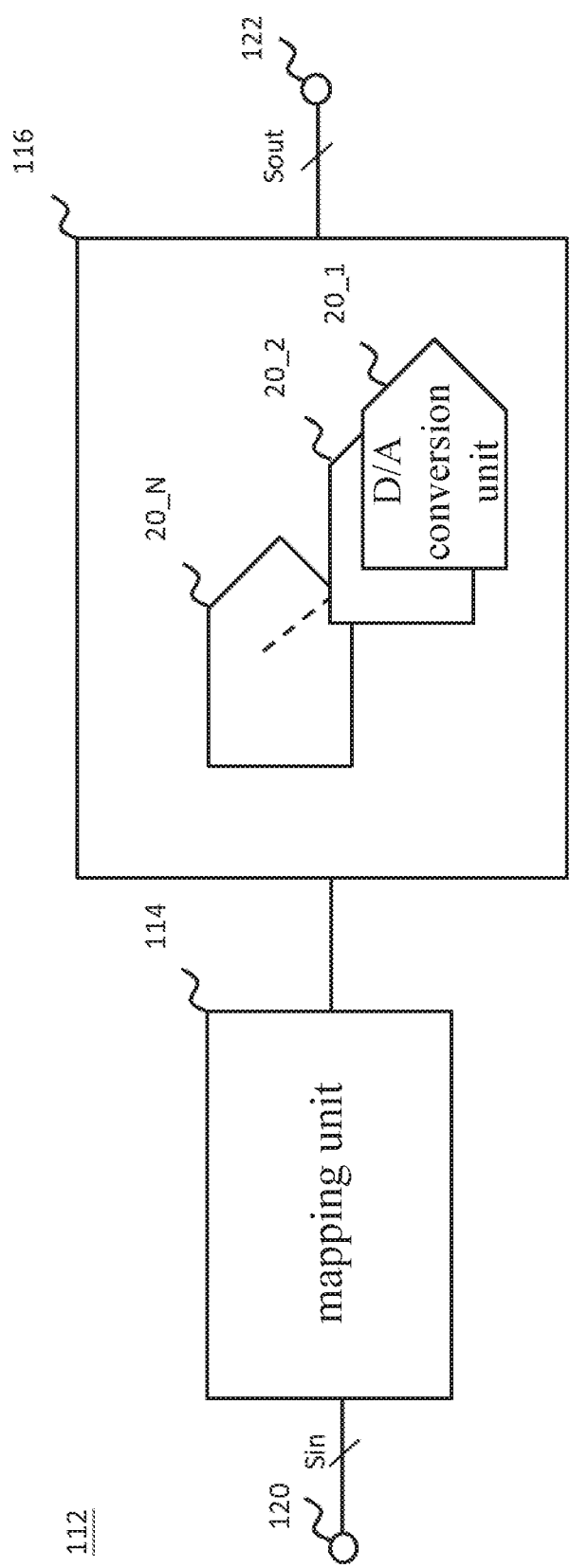
FIG. 2 is schematic block diagram of a data converter according to one embodiment of the present application.

FIG. 2 is a schematic block diagram illustrating the data converter 112 according to one embodiment of the present application. Referring to FIG. 2, the data converter 112 includes an input terminus 120 configured to receive the input signal Sin of the multi-bit, an output terminus 122 configured to output the output signal Sout, a mapping unit 114 and a D/A converter 116.

The D/A converter 116 includes D/A conversion units 20_1, 20_2, . . . 20_N, wherein N is a positive integer. The converter 116 is configured to generate the output signal Sout. The D/A converter 116 can be any circuit unit capable of converting the digital signal into the analog signal, such as, current, charge or voltage. For example, the D/A converter 116 may include a current source, capacitor, resistor, or any other electronic component fitting the above-mentioned definition.

The mapping unit 114 is coupled between the input terminus 120 and the D/A converter 116 and is configured to cause D/A conversion units 20_1, 20_2, . . . 20_N, according to specific electrical characteristics of the D/A conversion units 20_1, 20_2, . . . 20_N, to be equivalently arranged in a relative order in which the plurality of D/A conversion units 20_1, 20_2, . . . 20_N are selected for digital-to-analog conversion. Specifically, the equivalent arrangement does not mean to arrange the D/A conversion units 20_1, 20_2, . . . 20_N in a circuit layout according to specific electrical characteristics of the D/A conversion units 20_1, 20_2, . . . 20_N; rather, the mapping unit 114 is used to configure the connection relationship between D/A conversion units 20_1, 20_2, . . . 20_N and the incremental data weighted averaging circuit 110.

For example, whenever the data converter 112 is shipped out of the factory or everytime powered on, the specific electrical characteristics of the D/A conversion units 20_1, 20_2, . . . 20_N are measured respectively to generate a plurality of measurement results, and the mapping unit 114 is programmed according to the plurality of measurement results; however, the present application is not limited thereto. It is feasible to effectively inhibit the spurious tone of the multi-bit Δ-ΣA/D converter 10 using the mapping unit 114, thereby obtaining a better S/N ratio.

In some embodiments, the specific electrical characteristics are related to a current characteristic. For example, when the D/A conversion units 20_1, 20_2, . . . 20_N include a current source, the specific electrical characteristics include the current provided by the current source. The measurement of the current characteristics can be implemented using any existing technology.

In some embodiments, the specific electrical characteristics are related to a voltage characteristic. For example, when the D/A conversion units 20_1, 20_2, . . . 20_N include a capacitor, the specific electrical characteristics include the charges related to the voltage stored in the capacitor. The measurement of the voltage characteristics can be implemented using any existing technology.

To facilitate the discussion, in the following description of the present disclosure, the value of N is set as 33; i.e., the D/A converter 116 includes thirty-three D/A conversion units 20_1, 20_2, . . . 20_33.

Figure 3:
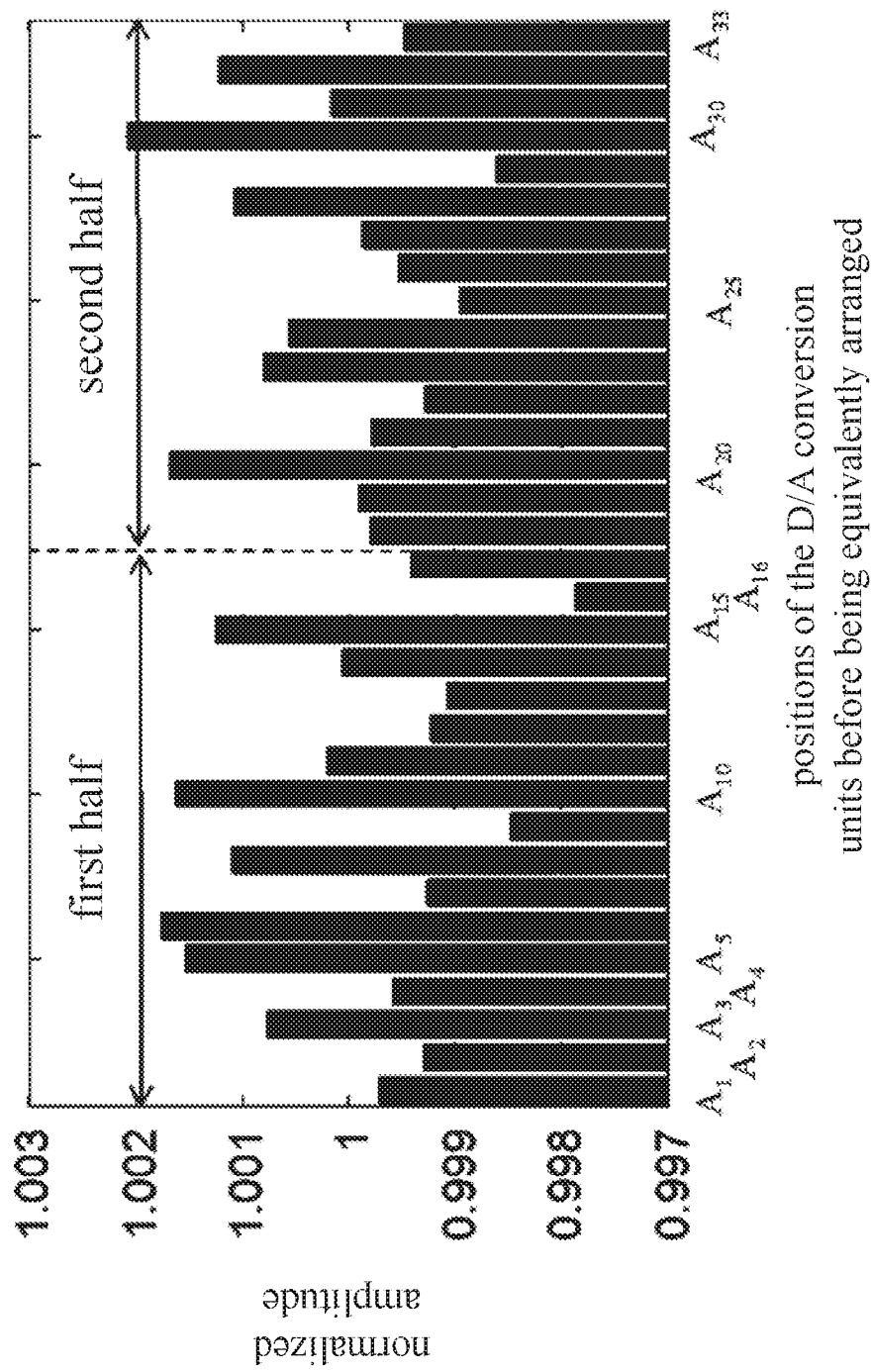
FIG. 3 is a histogram showing the amplitude of the specific electrical characteristic of a plurality of D/A conversion units according to one embodiment of the present application.

FIG. 3 is a histogram showing the amplitude of the specific electrical characteristics of a plurality of D/A conversion units 20_1, 20_2, . . . 20_33 according to one embodiment of the present application. Referring to FIG. 3, the horizontal axis represents the original order of the D/A conversion units 20_1, 20_2, . . . 20_33 before being equivalently arranged, from position $A_1$ to $A_{33}$; as could be appreciated, not all D/A conversion units are shown in the drawings for the sake of brevity. At the starting stage, the input signal Sin1 that the data converter 112 receives in the beginning would cause some of the D/A conversion units starting from the position $A_1$ to be selected, for example, some of the D/A conversion units positioned at $A_1$ to $A_{10}$ would be selected, depending on the size of the first input signal Sin1. Then, the second input signal Sin2 that the data converter 112 receives would cause some of the D/A conversion units starting from the position $A_{11}$ to be selected, such as, for example, some of the D/A conversion units positioned at $A_{11}$ to $A_{30}$ would be selected, depending on the size of the second input signal Sin2. Next, the third input signal Sin3 that the data converter 112 receives would cause some of the D/A conversion units starting from the position $A_{31}$ to be selected, if the number exceeds the position $A_{33}$, then it returns to the position $A_1$ for subsequent gating of the D/A conversion units; the third input signal Sin3 would cause some of the D/A conversion units from the positions $A_{31}$ to $A_{33}$ and then from positions $A_1$ to $A_6$ to be selected, and the subsequent operations go on like this.

The vertical axis in FIG. 3 represents the normalized amplitude of the specific electrical characteristics of the D/A conversion units 20_1, 20_2, . . . 20_33, wherein the normalization reference value is 1. Due to the changes during the manufacturing process, device mismatch errors may occur among each D/A conversion unit 20_1, 20_2, . . . 20_33, and accordingly, the level of the specific electrical characteristics may differ slightly. In other words, there is an electrical characteristic difference between the specific electrical characteristic of each D/A conversion unit 20_1, 20_2, . . . 20_33 and the reference value 1.

Reference is made back to FIG. 1. When the multi-bit Δ-ΣA/D converter 10 does not include the mapping unit 114, the D/A conversion units 20_1, 20_2, . . . 20_33 are directly under the control of the incremental data weighted averaging circuit 110. Reference is made back to FIG. 3 again, which shows that the D/A conversion units 20_1, 20_2, . . . 20_33 includes several D/A conversion units positioned at $A_1$ to $A_{17}$ and several D/A conversion units positioned at $A_{18}$ to $A_{33}$. In one scenario, the sum of the specific electrical characteristics of several D/A conversion units positioned at $A_1$ to $A_{17}$ is relatively larger, whereas the sum of the specific electrical characteristics of several D/A conversion units positioned at $A_{18}$-$A_{33}$ is relatively smaller. Under the above premise, once the selection pattern of the D/A conversion units 20_1, 20_2, . . . 20_33 becomes repetitive see FIG. 4 for detailed description), the spurious tone will be particularly significant, thereby worsening the S/N ratio.

Figure 4:
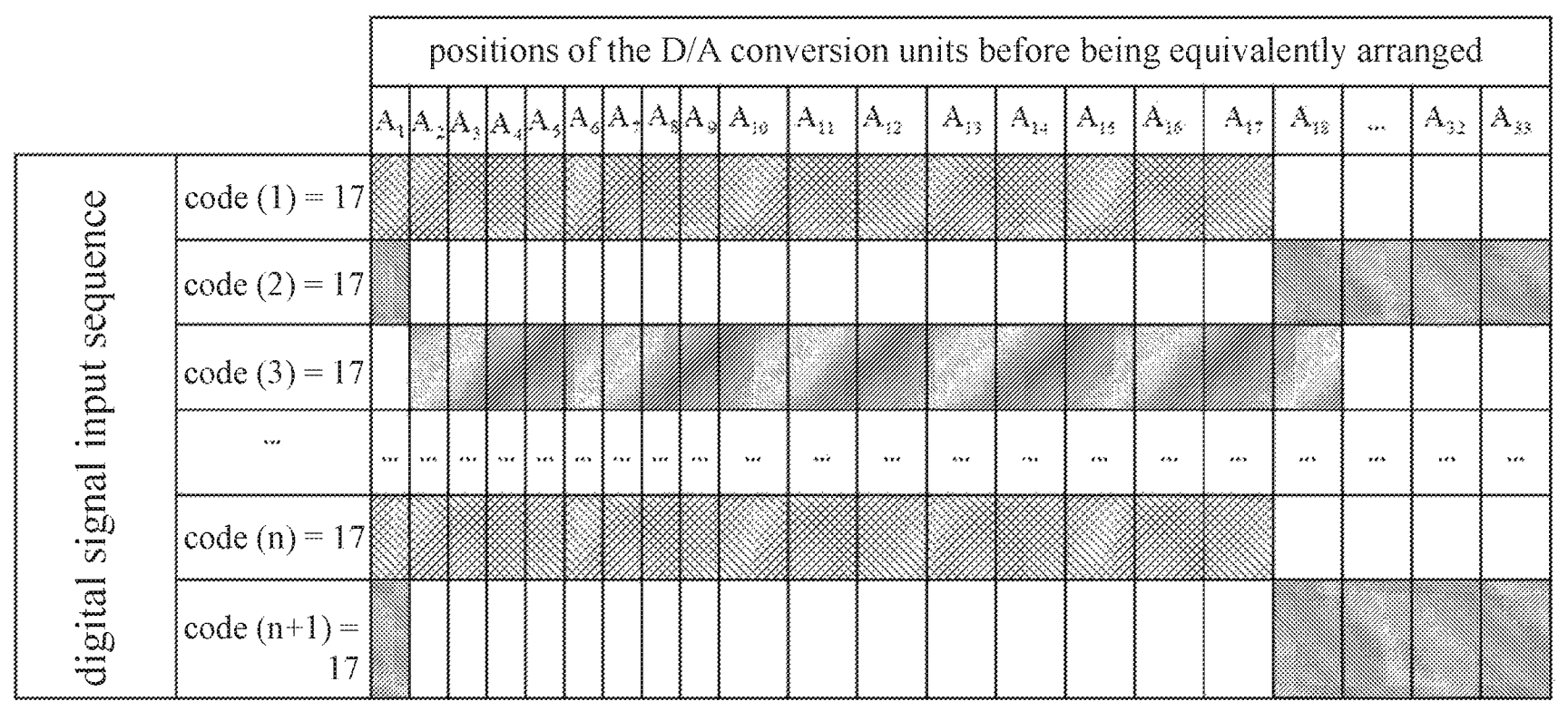

FIG. 4 is a schematic diagram illustrating the gating status of the D/A conversion units 20_1, 20_2, . . . 20_33, according to embodiments of the present application. Referring to FIG. 4, the code (1) in vertical column represents the quantized signal Q_D that the quantizer 104 generates at the beginning according to a first low-pass signal LPF_A; then, code (2) represents the quantized signal Q_D that the quantizer 104 generates according to a second low-pass signal LPF_A, and so on. The value after the equal sign of the code (1) represents the value of the quantized signal Q_D. For example, code (1)=16 means that the quantized signal Q_D is 16; that is, 16 D/A conversion units are selected according to the first low-pass signal LPF_A. At the starting stage, several D/A conversion units starting from the position $A_1$ are selected. In the present embodiment, several D/A conversion units positioned at $A_1$ to $A_{16}$ are selected. Because of the function of the incremental data weighted averaging circuit 110, when code (2)=17, several D/A conversion units starting from the $A_{17}$ after the position $A_{16n}$ are selected, until the D/A conversion unit at the position $A_{33}$ is selected. When code (3)=17, the gating returns to the position $A_1$, and several D/A conversion units positioned at $A_1$ to $A_{17}$ are selected. Similarly, when code (4)=16, several D/A conversion units positioned at $A_{18}$ to $A_{33}$ are selected. When code (5)=16, the gating returns to the position $A_1$, and several D/A conversion units positioned at $A_1$ to $A_{16}$ are selected. When code (6)=17, several D/A conversion units positioned at $A_{17}$ to $A_{33}$ are selected.

As shown in FIG. 4, when the digital signal input sequence is code (5) and code (6), the D/A conversion units that are selected are the same as those are selected when the digital signal input sequence is code (1) and code (2).

Therefore, the selection pattern is repetitive. In such cases (the sum of the specific electrical characteristics of several D/A conversion units positioned at $A_1$ to $A_{16}$ is relatively larger, whereas the sum of the specific electrical characteristics of several D/A conversion units positioned at $A_{17}$ to $A_{33}$ is relatively smaller), spurious tone will become particularly significant, thereby worsening the S/N ratio.

The D/A conversion units 20_1, 20_2, ... 20_33 can be arranged equivalently according to the electrical characteristic difference corresponding to each of the D/A conversion units 20_1, 20_2, ... 20_33 using the mapping unit 114. Therefore, it is feasible to effectively inhibit the spurious tone of the multi-bit Δ-ΣA/D converter 10, thereby obtaining a better S/N ratio.

Figure 5:
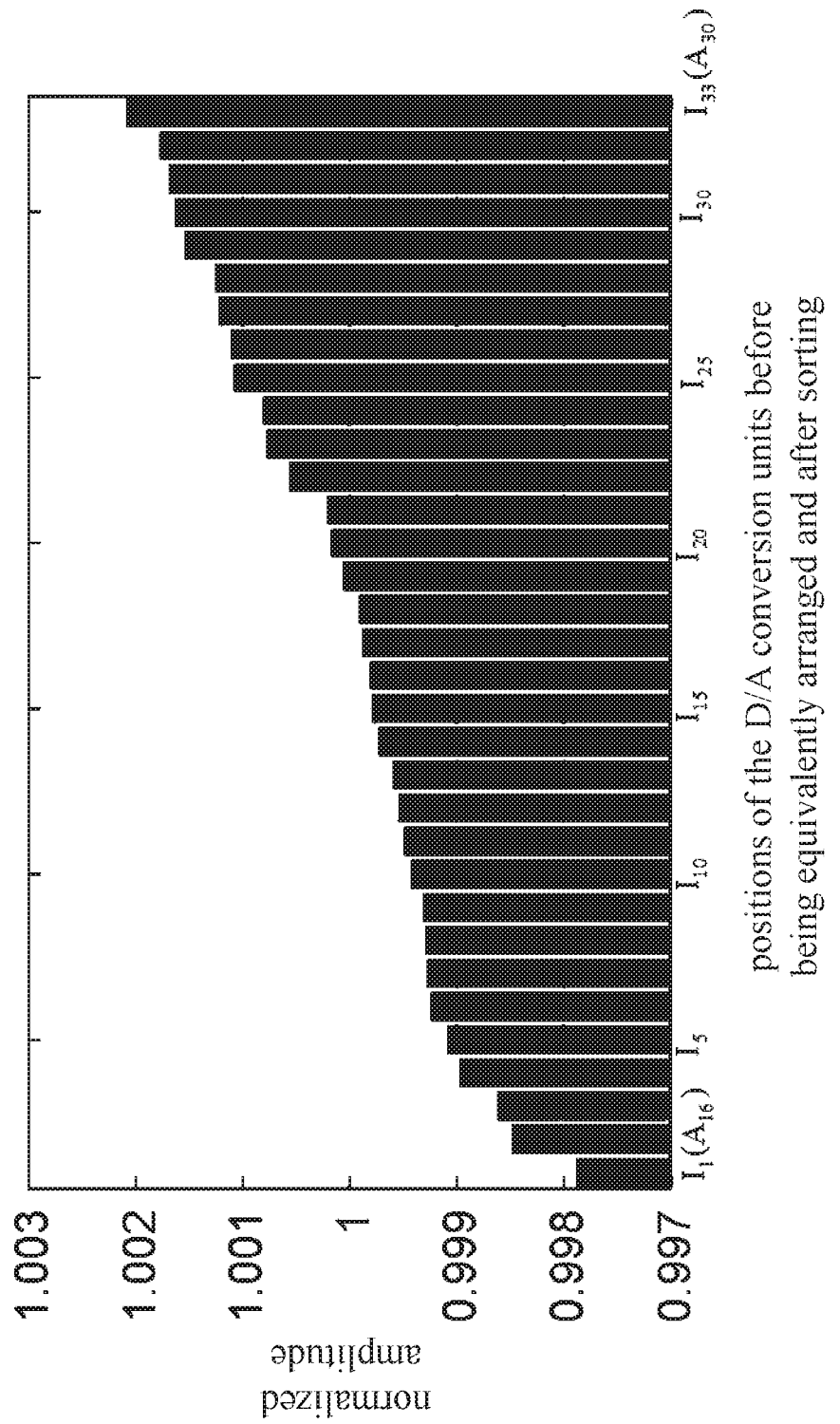
FIG. 5 is a histogram showing each amplitude shown in FIG. 3 before being equivalently arranged and after being sorted according to one embodiment of the present application.

FIG. 5 is a histogram showing each amplitude shown in FIG. 3 before being equivalently arranged and after being sorted according to one embodiment of the present application. Referring to FIG. 5, in which the horizontal axis represents the positions of the D/A conversion units 20_1, 20_2, ... 20_33 before being equivalently arranged and after sorting, from position $I_1$ to $I_{33}$; it should be noted that not all positions are shown in FIG. 5 for the sake of brevity. After the sorting, the D/A conversion unit at the position $A_{16}$ in FIG. 3 locates at the first position, $I_1$; similarly, the D/A conversion unit at the position $A_{30}$ in FIG. 3 locates at the last position, $I_{33}$. The mapping unit 114 sorts the specific electrical characteristics from in an ascending order. In this way, the mapping unit 114 can easily determine the level of the specific electrical characteristics of D/A conversion units 20_1, 20_2, ... 20_33, so that the subsequent equivalent arrangement of D/A conversion units 20_1, 20_2, ... 20_33 can be carried out in a relatively convenient way. It should be noted that this operation is optional. In some embodiments, this operation can be omitted.

Figure 6A:
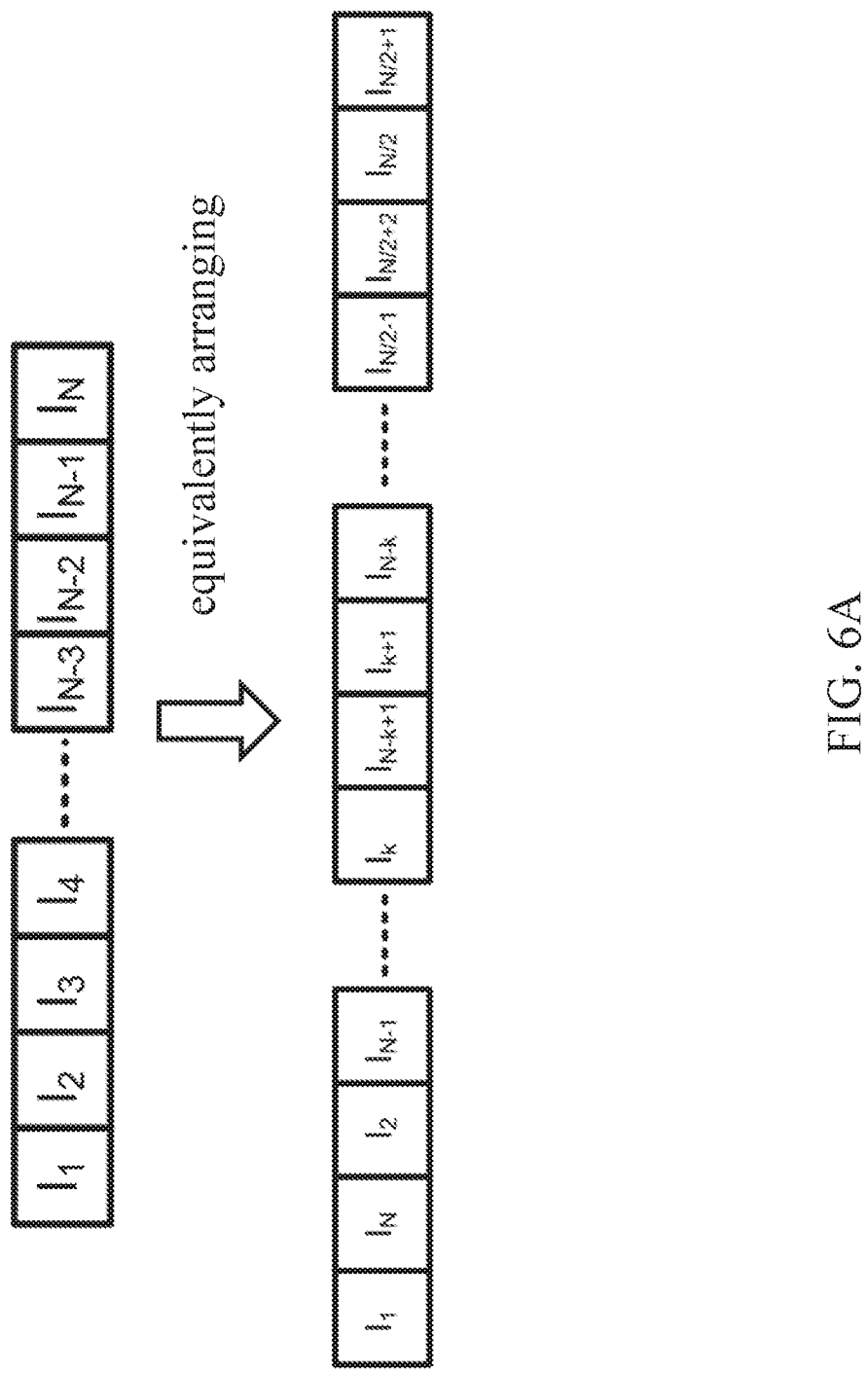
FIG. 6A is a schematic diagram illustrating a method for arranging an even number of D/A conversion units, according to the first embodiment of the present application.

FIG. 6A is a schematic diagram illustrating a method for arranging an even number of D/A conversion units, according to the first embodiment of the present application. Referring to FIG. 6A, the D/A conversion unit with the minimum specific electrical characteristic and locating at the position $I_1$ is equivalently arranged at the first position in a relative order, and the D/A conversion unit with the maximum specific electrical characteristic and locating at the position $I_{33}$ is equivalently arranged at the second position in the relative order; next, the D/A conversion unit with the second lowest specific electrical characteristic is equivalently arranged at the third position in the relative order, and the D/A conversion unit with the second largest specific electrical characteristic is equivalently arranged at the fourth position in the relative order, and so on. Put it simply, after the equivalent arrangement, the amplitude of the specific electrical characteristic of the D/A conversion unit that is selected as the $(2K-1)^{th}$ one in the relative order ranks the $K^{th}$ place among the amplitudes of the specific electrical characteristics of the plurality of D/A conversion units 20_1, 20_2, ... 20_33, and the amplitude of the specific electrical characteristic of the D/A conversion unit that is selected as the $2K^{th}$ one in the relative order ranks the $(N-K+1)^{th}$ place among the amplitudes of the specific electrical characteristics of the plurality of D/A conversion units 20_1, 20_2, ... 20_33, wherein N is the number of the plurality of D/A conversion units 20_1, 20_2, ... 20_33 (in the present embodiment, N is 33), and wherein K≥1 and K≤N. For example, in one embodiment, the equivalent arrangement is carried out according to the amplitude of the voltage related to the D/A conversion units; that is, the D/A conversion units with the maximum and minimum amplitude of the voltage related to the D/A conversion units are put in the first and the second position, and then, the D/A conversion units with the second largest and smallest amplitude of the voltage are put at the third and fourth position, and so on, and the D/A conversion units with the voltage amplitudes ranking at the $k^{th}$ and $(N-k+1)^{th}$ are put at the $(2k-1)^{th}$ and $2k^{th}$ position.

Figure 6B:
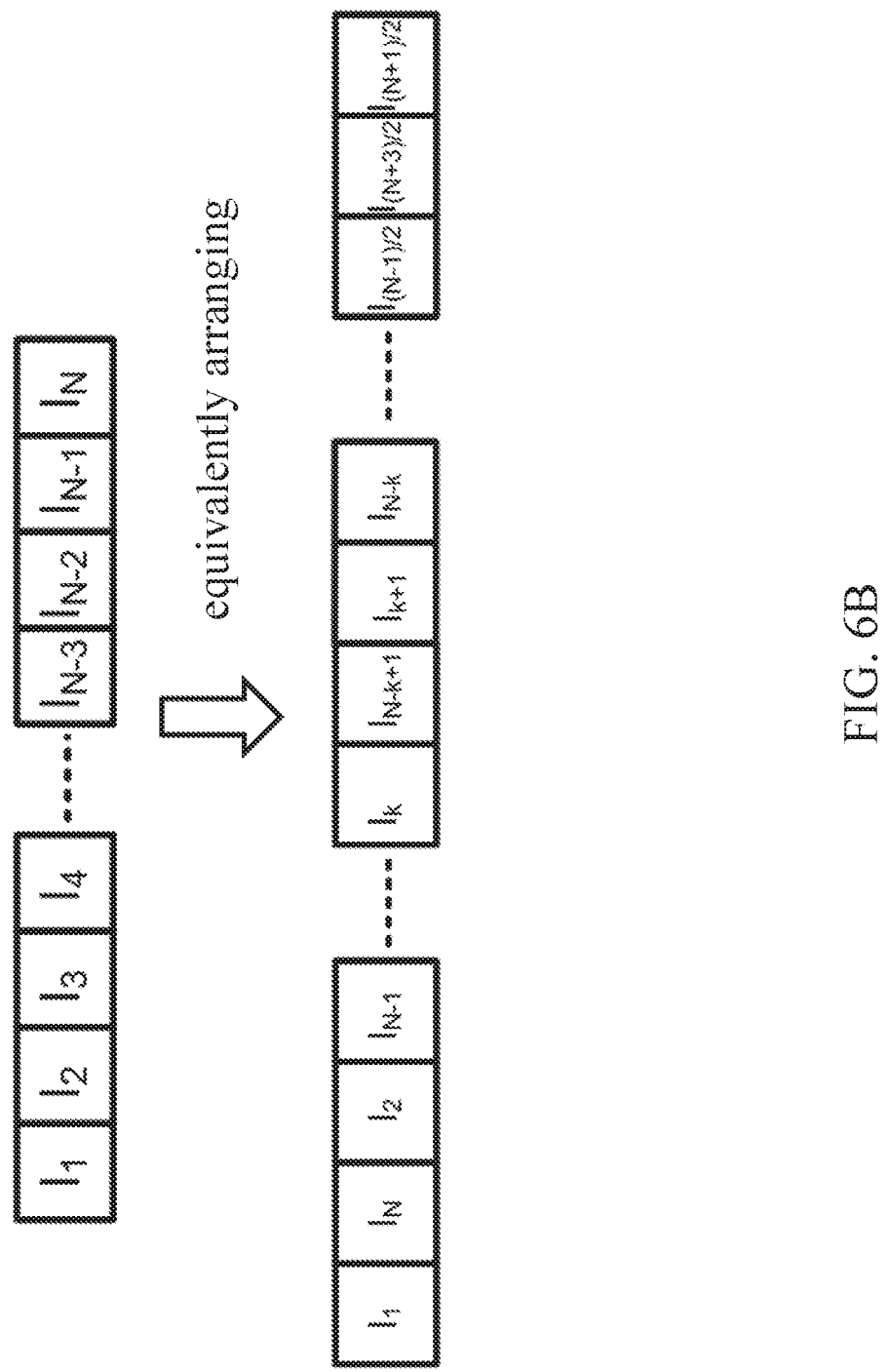
FIG. 6B is a schematic diagram illustrating a method for arranging an odd number of D/A conversion units, according to the first embodiment of the present application.

FIG. 6B is a schematic diagram illustrating a method for arranging an odd number of D/A conversion units, according to the first embodiment of the present application. Referring to FIG. 6B, the logic for equivalently arranging an odd number of D/A conversion units is the same as the logic for equivalently arranging an even number of D/A conversion units, and hence, a detailed description is omitted herein for the sake of brevity.

Figure 6C:
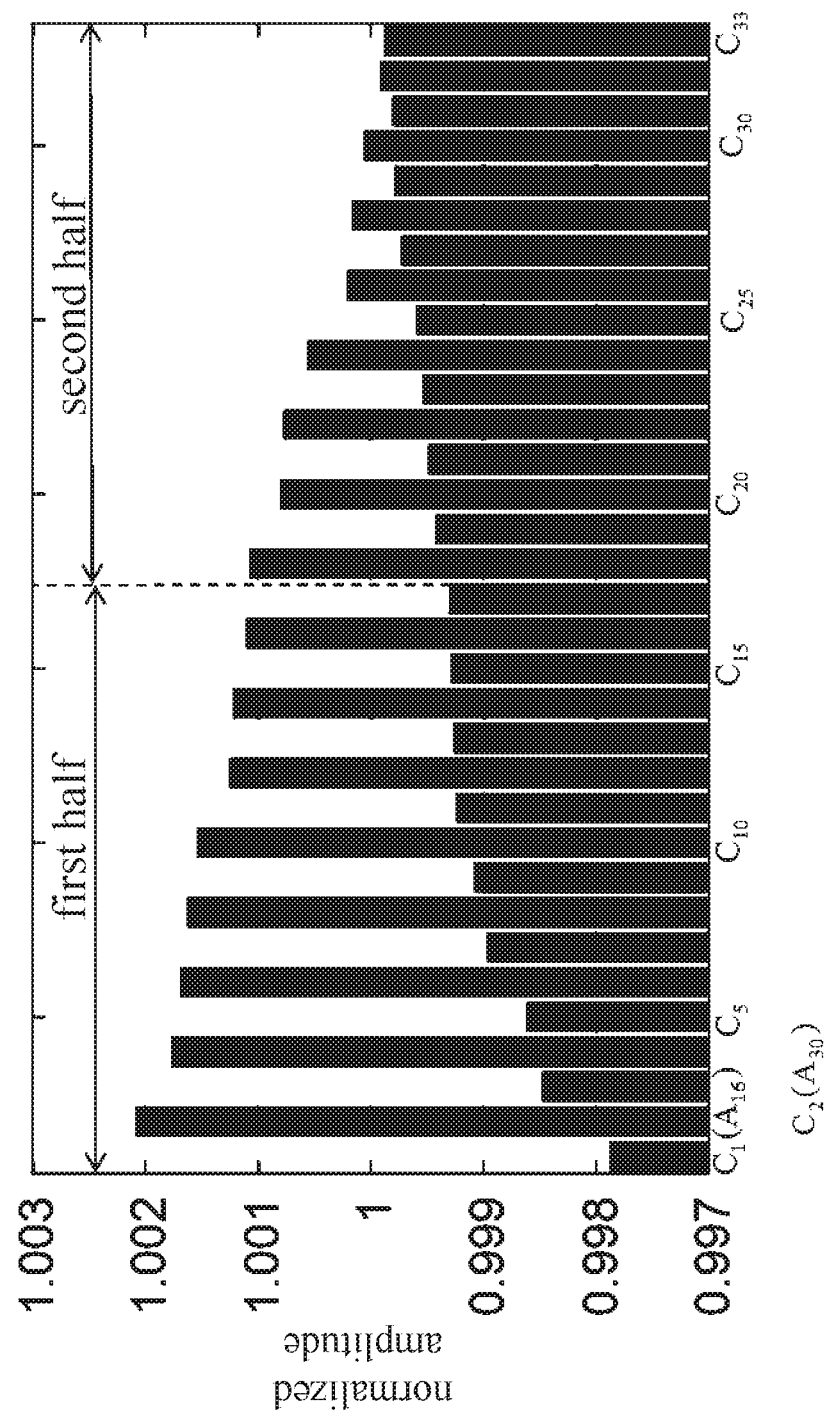
FIG. 6C is a histogram showing each amplitude shown in FIG. 5 after being equivalently arranged using the method set forth in FIG. 6B according to one embodiment of the present application.

FIG. 6C is a histogram showing each amplitude shown in FIG. 5 after being equivalently arranged using the method set forth in FIG. 6B. Referring to FIG. 6C, wherein the horizontal axis represents the positions of the D/A conversion units 20_1, 20_2, ... 20_33 after being equivalently arranged, from position $C_1$ to $C_{33}$, it should be noted that not all positions are shown in FIG. 6C for the sake of brevity. At the starting stage, the first input signal Sin1 that the data converter 112 receives in the beginning causes several D/A conversion units starting from the position $C_1$ to be selected, such as, several D/A conversion units positioned at $C_1$ to $C_{10}$, according to the level of the first input signal Sin1. Then, the second input signal Sin2 that the data converter 112 receives cause several D/A conversion units starting from the position $C_{11}$ to be selected, such as, several D/A conversion units positioned at $C_{11}$ to $C_{30}$, according to the level of the second input signal Sin2. Next, third input signal Sin3 that the data converter 112 receives causes the several D/A conversion units starting from the position $C_{31}$ to be selected, if the number exceeds the position $C_{33}$, then it returns to the position $C_1$ for subsequent gating of the D/A conversion units, and the subsequent operations go on like this.

As shown in FIG. 6C, after equivalently arranging the D/A conversion units 20_1, 20_2, ... 20_33, the D/A conversion unit locating at the position $A_{16}$ before the equivalent arrangement now locates at the position $C_1$; and the D/A conversion unit locating at the position $A_{30}$ before the equivalent arrangement now locates at the position $C_2$.

Moreover, for D/A conversion units 20_1, 20_2, ... 20_33 after being equivalently arranged, the amplitudes of the specific electrical characteristics of several D/A conversion units arranged in odd positions (such as, positions $C_1$, $C_3$, $C_5$) are in an ascending order. Moreover, for D/A conversion units 20_1, 20_2, ... 20_33 after being equivalently arranged, the amplitudes of the specific electrical characteristics of several D/A conversion units arranged in odd positions (such as, position $C_2$, $C_4$, $C_6$) are in a descending order. However, the present application is not limited thereto. In other embodiments, for D/A conversion units 20_1, 20_2, ... 20_33 after being equivalently arranged, the amplitudes of the specific electrical characteristics of several D/A conversion units arranged in odd positions are in a descending order, and for D/A conversion units 20_1, 20_2, ... 20_33 after being equivalently arranged, the amplitudes of the specific electrical characteristics of several D/A conversion units arranged in odd positions are in an ascending order.

Returning back to FIG. 3, before being equivalently arranged, the several D/A conversion units of the first half of the D/A conversion units 20_1, 20_2, ... 20_33 locate at positions $A_1$ to $A_{17}$. The sum of the electrical characteristic differences corresponding to each of the several D/A conversion units at positions $A_1$ to $A_{17}$ is a first sum. Before being equivalently arranged, the several D/A conversion units of the second half of the D/A conversion units 20_1, 20_2, . . . 20_33 locate at positions $A_{18}$ to $A_{33}$. The sum of the electrical characteristic differences corresponding to each of the several D/A conversion units at positions $A_{18}$ to $A_{33}$ is a second sum.

Returning back to FIG. 6C, after being equivalently arranged, the several D/A conversion units of the first half of the D/A conversion units 20_1, 20_2, . . . 20_33 locate at positions $C_1$ to $C_{17}$. The sum of the electrical characteristic differences corresponding to each of the several D/A conversion units at positions $C_1$ to $C_{17}$ is a third sum. After being equivalently arranged, the several D/A conversion units of the second half of the D/A conversion units 20_1, 20_2, . . . 20_33 locate at positions $C_{18}$ to $C_{33}$. The sum of the electrical characteristic differences corresponding to each of the several D/A conversion units at positions $C_{18}$ to $C_{33}$ is a fourth sum. The difference between the third sum and the fourth sum is smaller than the difference between the first sum and the second sum. In other words, for equivalently arranged D/A conversion units 20_1, 20_2, . . . 20_33, the difference between the electrical characteristic difference of several D/A conversion units at the first half and the electrical characteristic difference of several D/A conversion units at the second half is relatively small. In this way, even the selection pattern exhibits the repetitive shown in FIG. 4, it is feasible to inhibit the spurious tone of the multi-bit Δ-ΣA/D converter 10, thereby obtaining a better S/N ratio.

Moreover, other embodiments of the present application further include the arrangement patterns derived from FIG. 6C. For example, the position $C_1$ shifts backward by one position, and accordingly, the position $C_2$ shifts backward by one position, and so on. The position $C_{33}$ then shifts to the position of the current position $C_1$. Such arrangement also falls within the scope of the second embodiment of the present application. Moreover, in the above-mentioned example, the number of the shift is just an example. In the present application, the number by which the position is shifted can be any number.

Figure 7:
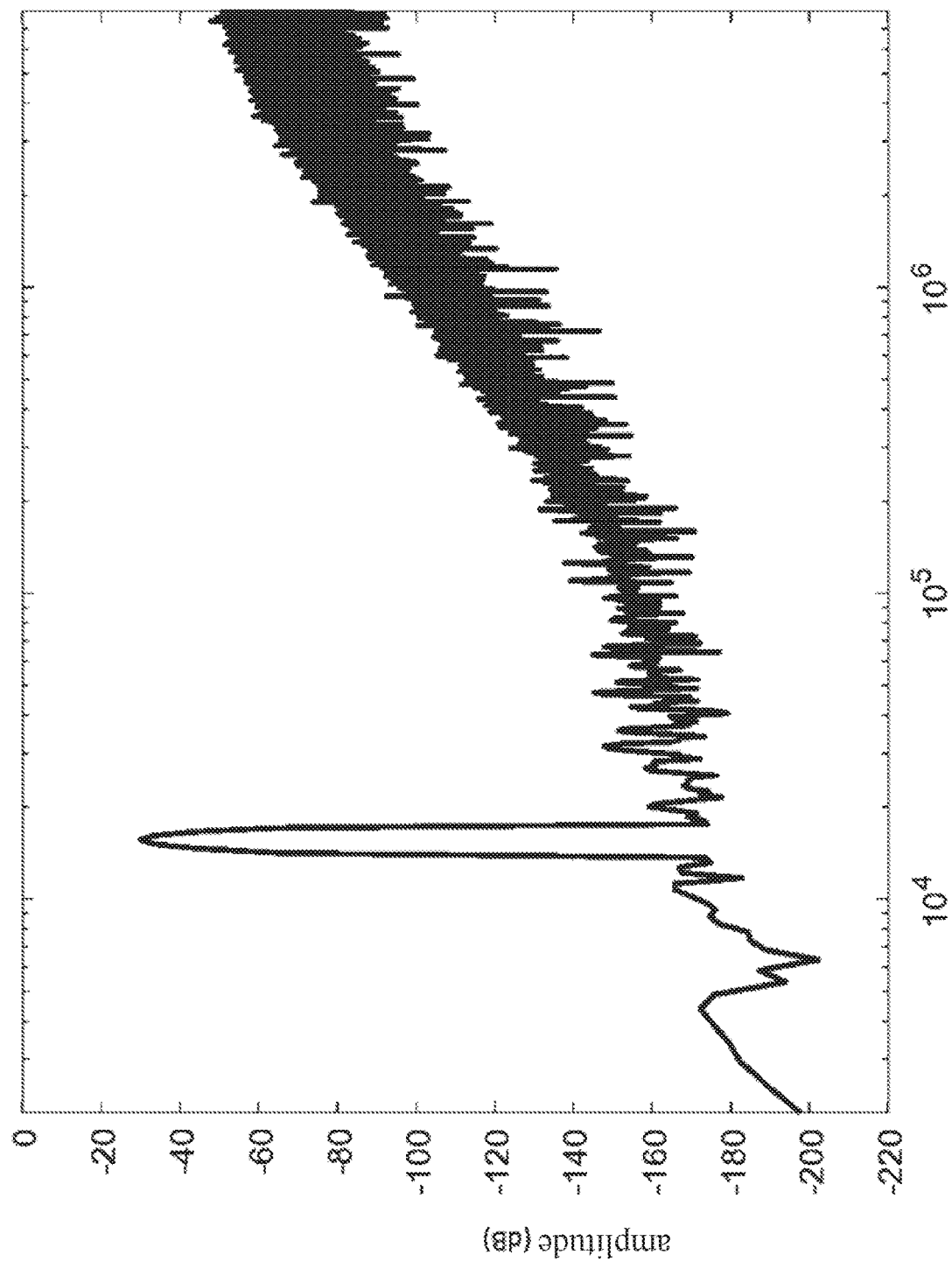
FIG. 7 is a spectrogram of the digital signal outputted by the multi-bit Δ-ΣA/D converter according to one embodiment of the present application.

FIG. 7 is a spectrogram of the digital signal outputted by the multi-bit Δ-ΣA/D converter 10 according to one embodiment of the present application. Referring to FIG. 7, the horizontal axis is frequency (Hz); and the vertical axis is the amplitude (dB). The spectrogram shown in FIG. 7 evidences that the spurious tone of the multi-bit Δ-ΣA/D converter 10 can be inhibited effectively.

Figure 8A:
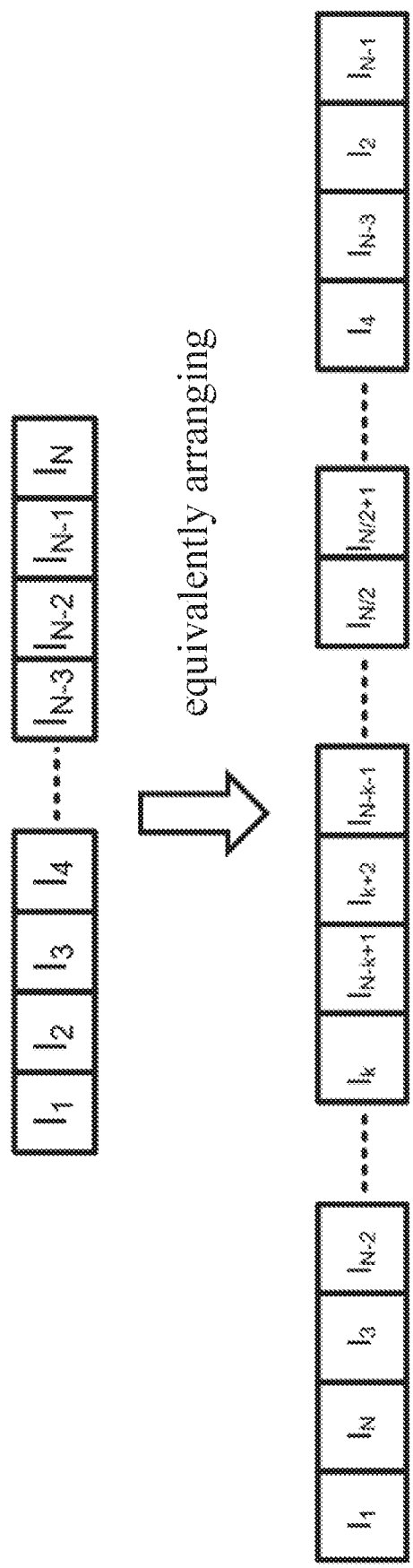
FIG. 8A is a schematic diagram illustrating a method for arranging an even number of D/A conversion units, according to the second embodiment of the present application.

FIG. 8A is a schematic diagram illustrating a method for arranging an even number of D/A conversion units, according to the second embodiment of the present application. Referring to FIG. 8A, the D/A conversion unit with the minimum specific electrical characteristic and locating at the position $I_1$ is equivalently arranged at the first position in a relative order, and the D/A conversion unit with the maximum specific electrical characteristic and locating at the position $I_{33}$ is equivalently arranged at the second position in the relative order; next, the D/A conversion unit with the second lowest specific electrical characteristic is equivalently arranged at the second last position in the relative order, and the D/A conversion unit with the second largest specific electrical characteristic is equivalently arranged at the last position in the relative order, and so on.

Figure 8B:
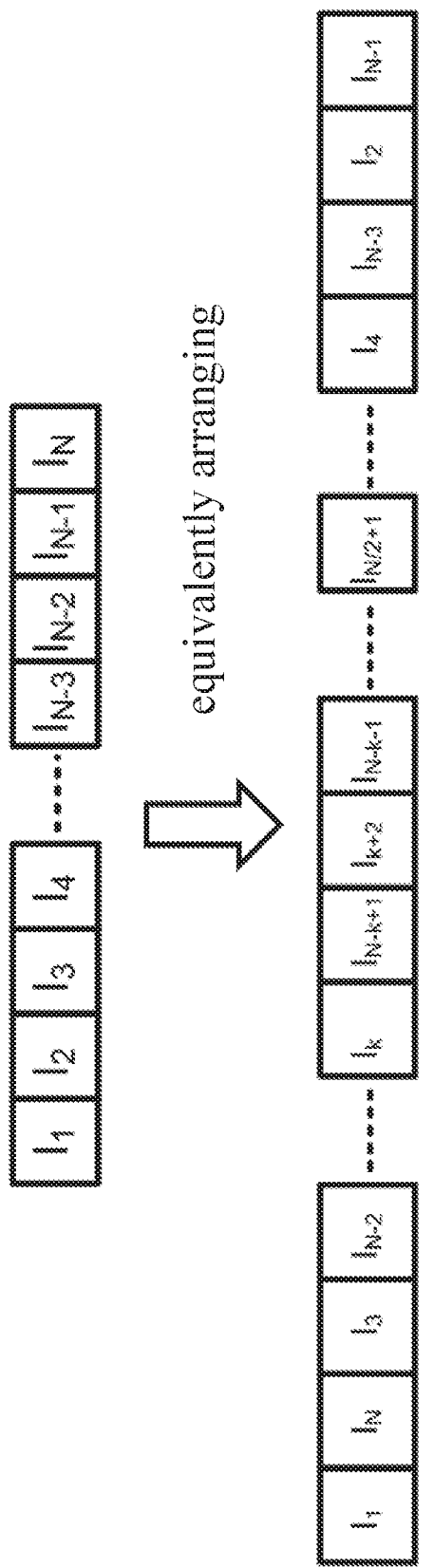
FIG. 8B is a schematic diagram illustrating a method for arranging an odd number of D/A conversion units, according to the second embodiment of the present application.

FIG. 8B is a schematic diagram illustrating a method for arranging an odd number of D/A conversion units, according to the second embodiment of the present application. Referring to FIG. 8B, the logic for equivalently arranging an odd number of D/A conversion units is the same as the logic for equivalently arranging an even number of D/A conversion units, and hence, a detailed description is omitted herein for the sake of brevity.

Figure 8C:
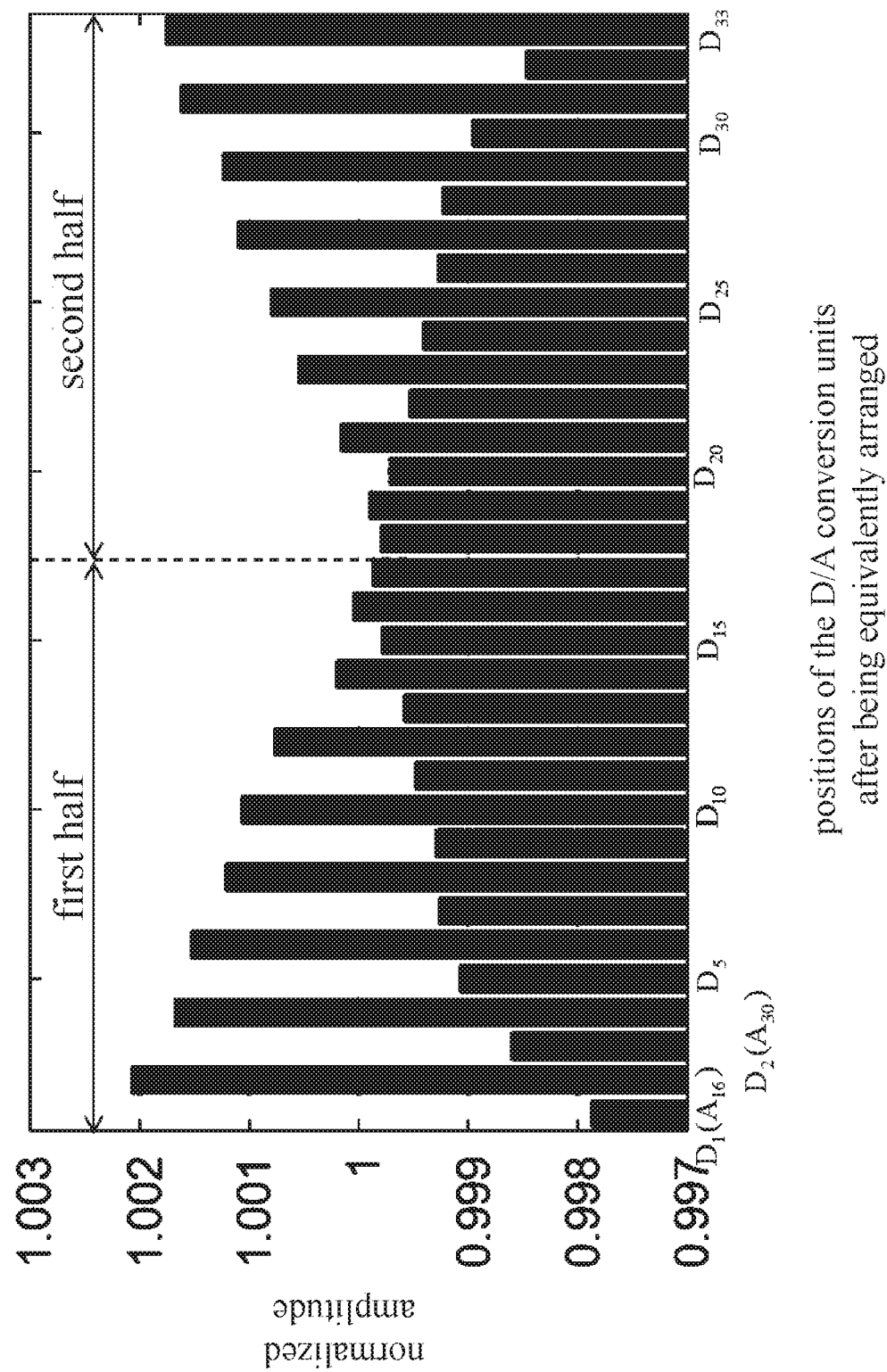
FIG. 8C is a histogram showing each amplitude shown in FIG. 5 after being equivalently arranged using the method set forth in FIG. 8B according to one embodiment of the present application.

FIG. 8C is a histogram showing each amplitude shown in FIG. 5 after being equivalently arranged using the method set forth in FIG. 8B. Referring to FIG. 8C, wherein the horizontal axis represents the positions of the D/A conversion units 20_1, 20_2, . . . 20_33 after being equivalently arranged, from position $D_1$ to $D_{33}$, it should be noted that not all positions are shown in FIG. 8C for the sake of brevity. At the starting stage, the first input signal Sin1 that the data converter 112 receives in the beginning causes several D/A conversion units starting from the position $C_1$ to be selected, such as, several D/A conversion units positioned at $D_1$ to $D_{10}$, according to the level of the first input signal Sin1. Then, the second input signal Sin2 that the data converter 112 receives cause several D/A conversion units starting from the position $D_{11}$ to be selected, such as, several D/A conversion units positioned at $D_{11}$ to $D_{30}$, according to the level of the second input signal Sin2. Next, third input signal Sin3 that the data converter 112 receives causes the several D/A conversion units starting from the position $D_{31}$ to be selected, if the number exceeds the position $D_{33}$, then it returns to the position $D_1$ for subsequent gating of the D/A conversion units, and the subsequent operations go on like this.

As shown in FIG. 8C, after equivalently arranging the D/A conversion units 20_1, 20_2, . . . 20_33, the D/A conversion unit locating at the position $A_{16}$ before the equivalent arrangement now locates at the position $D_1$; and the D/A conversion unit locating at the position $A_{30}$ before the equivalent arrangement now locates at the position $D_2$.

Moreover, for D/A conversion units 20_1, 20_2, . . . 20_33 after being equivalently arranged, the amplitudes of the specific electrical characteristics of a portion of the several D/A conversion units arranged in odd positions (such as, positions $D_1$, $D_3$, $D_5$) are in an ascending order, whereas the amplitudes of the specific electrical characteristics of the remaining portion of the several D/A conversion units arranged in odd positions are in a descending order.

Also, for D/A conversion units 20_1, 20_2, . . . 20_33 after being equivalently arranged, the amplitudes of the specific electrical characteristics of a portion of several D/A conversion units arranged in odd positions (such as, position $D_2$, $D_4$, $D_6$) are in a descending order, whereas the amplitudes of the specific electrical characteristics of the remaining portion of the several D/A conversion units arranged in even positions are in an ascending order. However, the present application is not limited thereto.

After being equivalently arranged, the several D/A conversion units of the first half of the D/A conversion units 20_1, 20_2, . . . 20_33 locate at positions $D_1$ to $D_{17}$. The sum of the electrical characteristic differences corresponding to each of the several D/A conversion units at positions $D_1$ to $D_{17}$ is a fifth sum. After being equivalently arranged, the several D/A conversion units of the second half of the D/A conversion units 20_1, 20_2, . . . 20_33 locate at positions $D_{18}$ to $D_{33}$. The sum of the electrical characteristic differences corresponding to each of the several D/A conversion units at positions $D_{18}$ to $D_{33}$ is a sixth sum. The difference between the fifth sum and the sixth sum is smaller than the difference between the first sum and the second sum. In some specific embodiments, the difference between the fifth sum and the sixth sum is smaller than the difference between the third sum and the fourth sum.

Even the selection pattern exhibits the repetitive shown in FIG. 4, the spurious tone of the multi-bit Δ-ΣA/D converter 10 can still be inhibited by using the mapping unit 114, thereby obtaining a better S/N ratio.

Moreover, other embodiments of the present application further include the arrangement patterns derived from FIG. 8C. For example, the position $D_1$ shifts backward by one position, and accordingly, the position $D_2$ shifts backward by one position, and so on. The position $D_{33}$ then shifts to the position of the current position $D_1$. Such arrangement also falls within the scope of the second embodiment of the present application. Moreover, in the above-mentioned example, the number of the shift is just an example. In the present application, the number by which the position is shifted can be any number.

Figure 9:
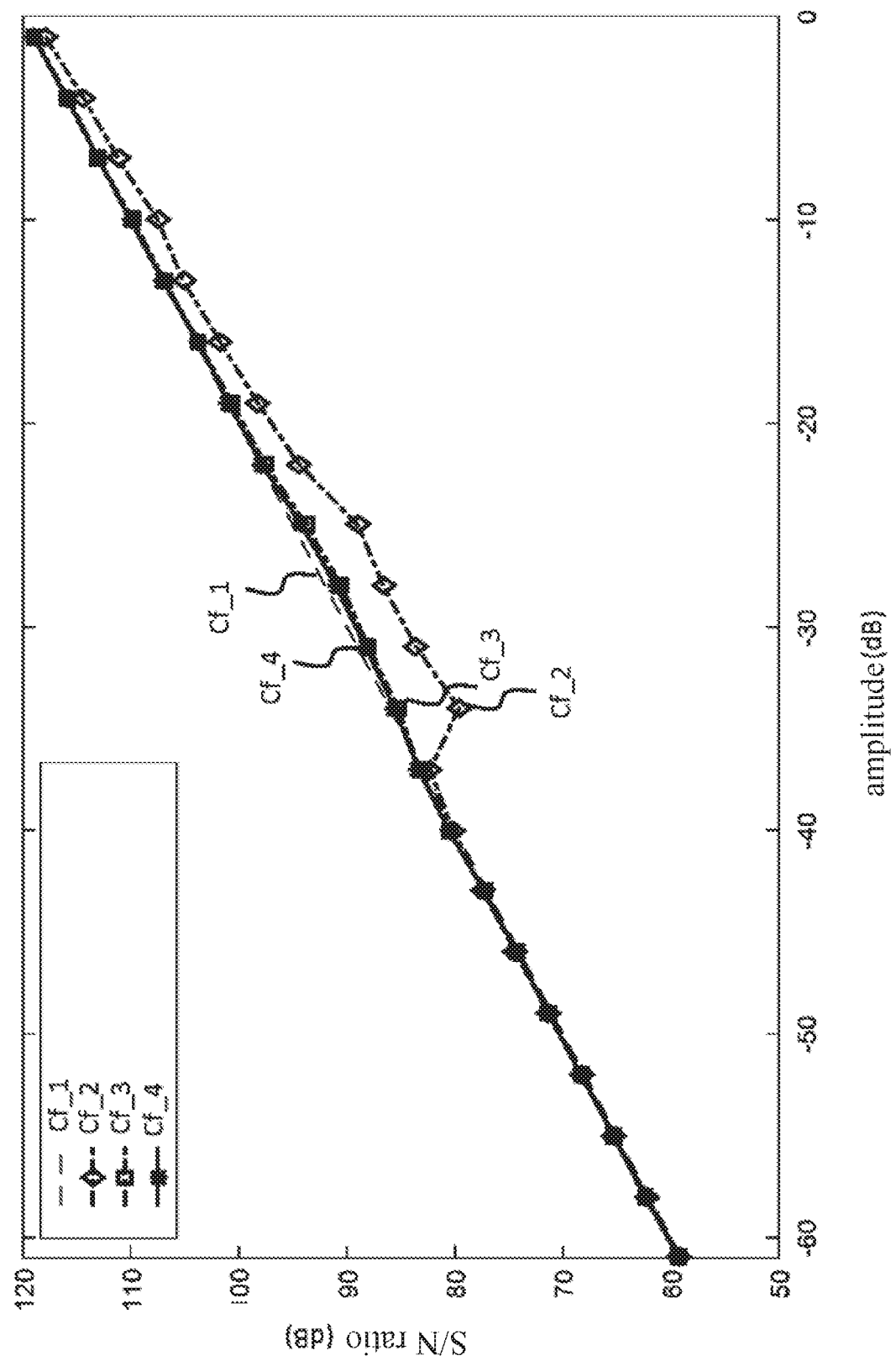
FIG. 9 shows the wave forms of S/N ratios of multi-bit Δ-ΣA/D converters that includes or does not includes the data converter according to one embodiment of the present application.

FIG. 9 shows the wave forms of S/N ratios of multi-bit Δ-ΣA/D converters that includes or does not includes the data converter 10 according to one embodiment of the present application. Referring to FIG. 9, the horizontal axis is the amplitude (dB); and the vertical axis is the S/N ratio (dB). FIG. 9 shows curves Cf_1, Cf_2, Cf_3 and Cf_4. Curve Cf_1 represents the S/N ratio under an ideal situation. Curve Cf_2 represents the S/N ratio of a multi-bit Δ-ΣA/D converter that does not include the data converter 10 according to the present application. Curve Cf_3 represents the S/N ratio of the mapping unit 114 obtained using the arrangement pattern according to the first embodiment of the present application. Curve Cf_4 represents the S/N ratio of the mapping unit 114 obtained using the arrangement pattern according to the second embodiment of the present application. As could be seen in FIG. 9, the multi-bit Δ-ΣA/D converter 10 may exhibit a better S/N ratio by using the mapping unit 114.

In some embodiments, a chip including data converter 11210 is provided; for example, the chip can be a semiconductor chip implemented by different manufacturing process.

In some embodiments, a chip including the multi-bit Δ-ΣA/D converter 10 is provided; for example, the chip can be a semiconductor chip implemented by different manufacturing process.

Figure 10:
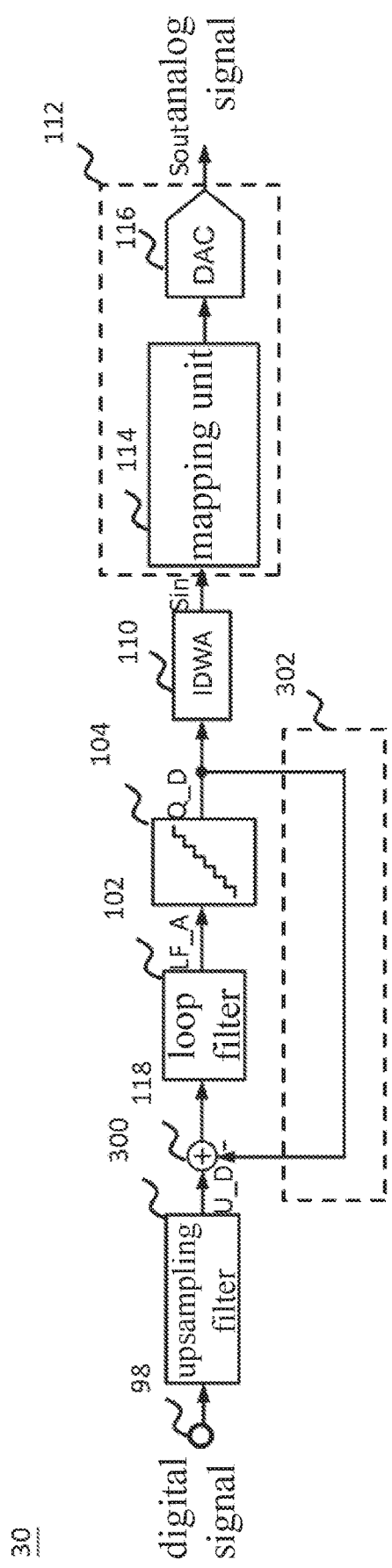
FIG. 10 is a schematic block diagram of the multi-bit Δ-ΣD/A converter according to one embodiment of the present application.

FIG. 10 is a schematic block diagram illustrating the multi-bit Δ-ΣD/A converter 30 according to embodiments of the present application. Referring to FIG. 10, the multi-bit Δ-ΣD/A converter 30 is similar to the multi-bit Δ-ΣA/D converter 10 shown in FIG. 1, except that the multi-bit Δ-ΣD/A converter 30 includes an upsampling filter 300 and a feedback loop 302. The feedback loop 302 is configured to feed the output terminus of the quantizer 104 back to the output terminus of the upsampling filter 300.

The input terminus 98 is configured to receive the digital signal, the upsampling filter 300 is coupled to the input terminus 98 and generates an upsampled signal U_D according to the digital signal. The loop filter 102 is configured to generate a loop filter signal LF_A according to the upsampled signal U_D and a quantized signal Q_D of the feedback loop 302; the quantizer 104 is coupled to the loop filter 102 and is configured to generate the quantized signal Q_D according to the loop filter signal LF_A. The incremental data weighted averaging circuit 110 is configured to provide the input signal Sin that the data converter 112 needs based on the quantized signal Q_D. The data converter 112 is configured to generate an output signal Sout as the analog signal based on the input signal Sin.

It is feasible to effectively inhibit the spurious tone of the multi-bit Δ-ΣD/A converter 30 by using the mapping unit 114, thereby obtaining a better S/N ratio.

In some embodiments, a chip includes the multi-bit Δ-ΣD/A converter 30; for example, the chip can be semiconductor chips implemented by different manufacturing processes.

The foregoing outlines features of several embodiments so that those skilled in the art may better understand various aspects of the present disclosure. Those skilled in the art should appreciate that they may readily use the present disclosure as a basis for designing or modifying other processes and structures for carrying out the same purposes and/or achieving the same advantages of embodiments introduced herein. Those skilled in the art should also realize that such equivalent embodiments still fall within the spirit and scope of the present disclosure, and they may make various changes, substitutions, and alterations thereto without departing from the spirit and scope of the present disclosure.

What is claimed is:

1. A data converter, characterized by comprising:
   an input terminus, configured to receive an input signal;
   a digital-to-analog (D/A) converter, comprising plurality of D/A conversion units and configured to generate an output signal; and
   a mapping unit, coupled between the input terminus and the D/A converter and configured to cause the plurality of D/A conversion units, according to specific electrical characteristics of the plurality of D/A conversion units, to be equivalently arranged in a relative order in which the plurality of D/A conversion units are selected for digital-to-analog conversions;
   wherein
   the plurality of D/A conversion units include current sources, and the specific electrical characteristics include current provided by the current sources; or
   the plurality of D/A conversion units include capacitors, and the specific electrical characteristics include charges stored in the capacitor.

2. The data converter of claim 1, wherein the specific electrical characteristic of each of the plurality of D/A conversion units is different from a reference value by an electrical characteristic difference, and the mapping unit causes the plurality of D/A conversion units to be equivalently arranged according to the electrical characteristic difference corresponding to each of the plurality of D/A conversion units.

3. The data converter of claim 2, wherein a sum of the electrical characteristic difference corresponding to each of the first half of the plurality of D/A conversion units before being equivalently arranged is a first sum, a sum of the electrical characteristic difference corresponding to each of the second half of the plurality of D/A conversion units before being equivalently arranged is a second sum, a sum of the electrical characteristic difference corresponding to each of the first half of the plurality of D/A conversion units after being equivalently arranged is a third sum, a sum of the electrical characteristic difference corresponding to each of the second half of the plurality of D/A conversion units after being equivalently arranged is a fourth sum, and a difference between the third sum and the fourth sum is smaller than a difference between the first sum and the second sum.

4. The data converter of claim 2, wherein for the plurality of D/A conversion units after being equivalently arranged, the amplitudes of the specific electrical characteristics of the plurality of D/A conversion units arranged in odd positions are in an ascending order, and for the plurality of D/A conversion units after being equivalently arranged, the amplitude of the specific electrical characteristics of the plurality of D/A conversion units arranged in even position are in a descending order.

5. The data converter of claim 2, wherein in the relative order, the amplitude of the specific electrical characteristic of the $(2K-1)^{th}$ selected D/A conversion unit ranks the $K^{th}$ place among the amplitudes of the specific electrical characteristics of the plurality of D/A conversion units, and the amplitude of the specific electrical characteristics of the $2K^{th}$ selected D/A conversion unit ranks the $(N-K+1)^{th}$ place among the amplitudes of the specific electrical characteristics of the plurality of D/A conversion units, wherein N is the number of the plurality of D/A conversion units, and wherein K≥1 and K≤N.

6. The data converter of claim 2, wherein for the plurality of D/A conversion units after being equivalently arranged, the amplitudes of the specific electrical characteristics of the plurality of D/A conversion units arranged in odd position are in a descending order; and for the plurality of D/A conversion units after being equivalently arranged, the amplitude of the specific electrical characteristics of the plurality of D/A conversion units arranged in even position are in an ascending order.

7. A digital-to-analog (D/A) converter, configured to convert a digital signal into an analog signal, characterized in that the D/A converter comprises:
an input terminus, configured to receive the digital signal;
an upsampling filter, coupled to the input terminus and generates an upsampled signal according to the digital signal;
a quantizer, configured to generate a quantized signal according to the upsampled signal; and
the data converter of claim 1, configured to generate the analog signal according to the quantized signal.

8. The D/A converter of claim 7, further comprising:
a data weighted averaging circuit, coupled between the quantizer and the data converter and configured to provide the input signal to the input terminus of the data converter based on the quantized signal.

9. The D/A converter of claim 7, further comprising:
an incremental data weighted averaging circuit, coupled between the quantizer and the data converter and configured to provide the input signal to the input terminus of the data converter based on the quantized signal.

10. The D/A converter of claim 7, further comprising:
a feedback loop, configured to feed the quantized signal back to an output terminus of the upsampling filter.

11. An analog-to-digital (A/D) converter, configured to convert an analog signal into a digital signal, characterized in that the A/D converter comprising:
an input terminus, configured to receive the analog signal;
a low-pass filter, coupled to the input terminus and generates a low-pass signal according to the analog signal;
a quantizer, configured to generate a quantized signal according to the low-pass signal; and
a feedback loop, configured to feed the quantized signal back to an output terminus of the low-pass filter, wherein the feedback loop comprises:
a data converter, wherein the data converter comprising:
an input terminus, configured to receive an input signal;
a digital-to-analog (D/A) converter, comprising plurality of D/A conversion units and configured to generate an output signal; and
a mapping unit, coupled between the input terminus and the D/A converter and configured to cause the plurality of D/A conversion units, according to specific electrical characteristics of the plurality of D/A conversion units, to be equivalently arranged in a relative order in which the plurality of D/A conversion units are selected for digital-to-analog conversions;
wherein
the plurality of D/A conversion units include current sources, and the specific electrical characteristics include current provided by the current sources; or
the plurality of D/A conversion units include capacitors, and the specific electrical characteristics include charges stored in the capacitor.

12. The A/D converter of claim 11, further comprising:
a data weighted averaging circuit, coupled between the quantizer and the data converter and configured to provide the input signal to the input terminus of the data converter based on the quantized signal.

13. The A/D converter of claim 11, further comprising:
an incremental data weighted averaging circuit, coupled between the quantizer and the data converter and configured to provide the input signal to the input terminus of the data converter based on the quantized signal.

14. The A/D converter of claim 11, further comprising:
a decimation filter, configured to provide the digital signal based on the quantized signal.

15. A chip, characterized by comprising:
a data converter, comprising:
an input terminus, configured to receive an input signal;
a digital-to-analog (D/A) converter, comprising plurality of D/A conversion units and configured to generate an output signal; and
a mapping unit, coupled between the input terminus and the D/A converter and configured to cause the plurality of D/A conversion units, according to specific electrical characteristics of the plurality of D/A conversion units, to be equivalently arranged in a relative order in which the plurality of D/A conversion units are selected for digital-to-analog conversions;
wherein
the plurality of D/A conversion units include current sources, and the specific electrical characteristics include current provided by the current sources; or
the plurality of D/A conversion units include capacitors, and the specific electrical characteristics include charges stored in the capacitor.

* * * * *